United States Patent
Craninckx

(10) Patent No.: US 7,961,131 B2
(45) Date of Patent: Jun. 14, 2011

(54) CHARGE DOMAIN SUCCESSIVE APPROXIMATION ANALOG-TO-DIGITAL CONVERTER

(75) Inventor: Jan Craninckx, Boutersem (BE)

(73) Assignee: IMEC, Leuven (BE)

( * ) Notice: Subject to any disclaimer, the term of this patent is extended or adjusted under 35 U.S.C. 154(b) by 0 days.

(21) Appl. No.: 12/373,884

(22) PCT Filed: Jul. 4, 2007

(86) PCT No.: PCT/EP2007/056727
§ 371 (c)(1),
(2), (4) Date: Nov. 13, 2009

(87) PCT Pub. No.: WO2008/006751
PCT Pub. Date: Jan. 17, 2008

(65) Prior Publication Data
US 2010/0052957 A1 Mar. 4, 2010

Related U.S. Application Data

(60) Provisional application No. 60/831,171, filed on Jul. 14, 2006.

(30) Foreign Application Priority Data

Jan. 18, 2007 (EP) ..................... 07100741

(51) Int. Cl.
*H03M 1/12* (2006.01)
(52) U.S. Cl. .................... 341/172; 341/155
(58) Field of Classification Search .............. 341/155, 341/172
See application file for complete search history.

(56) References Cited

U.S. PATENT DOCUMENTS

| | | | |
|---|---|---|---|
| 6,118,400 A * | 9/2000 | Susak | 341/172 |
| 6,720,903 B2 * | 4/2004 | Confalonieri et al. | 341/172 |
| 7,015,841 B2 * | 3/2006 | Yoshida et al. | 341/120 |
| 2003/0063026 A1 | 4/2003 | Nandy | |
| 2006/0187106 A1 | 8/2006 | Mitra et al. | |
| 2006/0208935 A1 | 9/2006 | Hurrell et al. | |

OTHER PUBLICATIONS

Ogawa, Satomi, et al., "Clock-Feedthrough Compensated Switched-Capacitor Circuits", Proceedings of the International Symposium on Circuits and Systems, New York, IEEE, vol. 4, Conf. 25, May 3, 1992, pp. 1195-1198.
European Search Report, European Application No. EP 07 10 0741, dated Apr. 2, 2007.

* cited by examiner

*Primary Examiner* — Khai M Nguyen
(74) *Attorney, Agent, or Firm* — McDonnell Boehnen Hulbert & Berghoff LLP

(57) ABSTRACT

An analog to digital conversion circuit and method is presented. The analog to digital circuit (100) comprises a first capacitor (103), arranged for being switchably (102) connected on one side to an input voltage (101), at least one successive approximation circuit (104), a comparator (108) arranged for outputting a sign indicative of the difference between the voltage on the first capacitor (103) and a comparison voltage (109), and a control block (110), arranged for converting said comparator's output into steering signals and in a digital output signal. The successive approximation circuit comprises a second capacitive structure (106), switchably connected to a pre-charge circuit (107) arranged for pre-charging the second capacitive structure (106), whereby the second capacitive structure (106) is connected in parallel with the first capacitor (103) via a charge copying circuit (105). The steering signals comprise of a signal for steering (112) said charge copying circuit (105) and for steering (113) the pre-charge circuit (107).

28 Claims, 13 Drawing Sheets

CHARGE DOMAIN SUCCESSIVE APPROXIMATION ANALOG-TO-DIGITAL CONVERTER

CROSS REFERENCE TO RELATED APPLICATIONS

The present application is a national stage entry of PCT/EP07/56727, filed on Jul. 4, 2007, and claims priority to European Patent Application EP 07100741.3, filed in the European Patent Office on Jan. 18, 2007, and U.S. Patent Application No. 60/831,171 filed in the U.S. Patent Office on Jul. 14, 2006, the entire contents of both of which are incorporated herein by reference.

BACKGROUND

The present disclosure relates to the field of electronic systems and more particularly, to a method and a system for converting an analog signal to a digital signal.

An Analog-to-Digital Converter (ADC) is a prerequisite for most digital signal processing. Most signals are analog by nature and have to be converted to digital format for a further digital signal processing. For example in multi-mode transceiver systems but also in a lot of other applications, portable/battery powered instruments, industrial controls and data/signal acquisition, analog-to-digital conversion (ADC) is an important part of the power budget and should be optimized, both on the system level (by determining the optimum combination of analog baseband signal processing and ADC speed and resolution) and on the building block level by making an ADC with the best Figure of Merit (FoM). This FoM is determined as $$FoM = \frac{P}{2^{ENOB} \cdot F_{sample}}$$

and represents the energy used per conversion step. (P: power in W, $F_{sample}$: sample rate in 1/s, ENOB stands for the Effective Number of Bits.) State-of-the-Art ADCs achieve a FoM below 1 pJ (0.5 to 1 pJ/conversion step).

On top of that, scalability is also a major issue for multi-mode transceivers and an ADC topology is desirable that can scale its power consumption linearly with the requirements on accuracy and speed in order not to waste power in operating modes with lower requirements. State of the art solutions are not satisfactory. Some topologies offer scalable performance, but at the cost of a worse FoM.

A successive approximation ADC is a type of analog-to-digital converter that converts a continuous analog waveform into a discrete representation via a binary search through all possible quantization levels. A common form of analog to digital converter uses an array of capacitors that are controlled by successive approximation register (SAR) logic. A comparator is used to perform successive comparisons of the input voltage to a test voltage. The SAR ADC is low in cost and consumes low operating power.

A conventional SAR ADC with a sample-and-hold circuit is depicted in FIG. 1. The analog signal $V_{in}$ enters the sample-and-hold (S/H) circuit where the signal simply is sampled and held to provide a buffer for the ADC. $V_{in}$ is compared in the comparator to $V_{ref}$. The digital comparison result goes to the SAR. The SAR adjusts the digital control signals in order to narrow the compared voltages. An adjusted digital signal is output to a digital-to-analog converter (DAC). This signal is converted to an adjusted $V_{ref}$, which is compared to $V_{in}$ in the comparator. A number of examples can be found in the prior art as for example in US2006/0187106.

Since comparator speeds up to 1 GHz can easily be achieved in deep-submicron technologies, successive approximation ADCs are feasible for conversion speeds and accuracies in the range of 8-10 bits and 10-50 MHz. The most used topologies are capacitive-based, also known as charge redistribution SAR ADC. A number of systems are based on this principle, for example that disclosed in Publication No. US2003/0063026. These topologies have a lot of disadvantages. Since the number of conversion bits is determined sequentially, each bit of resolution requires a conversion operation. As a result, the conversion time tends to become unacceptably long for high-speed and high-resolution applications. A typical ADC employs a switching capacitor as the DAC; these devices tend to exhibit the traits of change injection during switching, as well as embodying long settling times. To achieve fast settling, opamps with large biasing currents are used, which makes it impossible to achieve a good FoM. As these opamps need constant biasing, power cannot be scaled linearly with conversion speed.

A typical capacitive SAR ADC needs a fast opamp at the input to settle fast to the required output voltage.

The paper "Clock-feedthrough compensated switched-capacitor circuits" (Ogawa et al., Proceedings Int'l Symposium on Circuits and Systems (ISCAS), 1992, pp. 1195-1198) gives a solution to the clock-feedthrough effect that typically occurs in switched-capacitor circuits. The proposed switched-capacitor circuits comprise opamps with large biasing currents. As these opamps need constant biasing, power cannot be scaled linearly with conversion speed. Moreover, such opamps with large biasing currents do not allow achieving a good Figure of Merit.

US2006/0208935-A1 relates to an A/D converter comprising several conversion engines collaborating together to determine during a single trial a plurality of bits. It also shows a single switched capacitor ADC conversion engine, comparable to a classical SAR ADC where a capacitor bank can be connected to an input, a reference voltage and ground.

SUMMARY

The present disclosure aims to provide a scalable SAR ADC with a fast settling time and a good figure of merit.

The present disclosure provides a circuit and a method to convert an analog signal to a digital signal. The principle is based on a classical Successive Approximation Register (SAR) Analog-to-Digital Converter (ADC). Instead of operating in the voltage-domain, the useful signal is represented by charge. A charge sharing SAR ADC is provided which has a fast settling time, has a good figure of merit and is scalable.

An analog to digital conversion circuit comprises a first capacitor, at least one successive approximation circuit, a comparator and a control block.

The first capacitor is arranged for being switchably connected on one side to an input voltage.

The successive approximation circuit comprises a second capacitive structure, switchably connected to a pre-charge circuit arranged for pre-charging the second capacitive structure. The second capacitive structure is connected in parallel with the first capacitor via a charge copying circuit.

The comparator is arranged for outputting a sign indicative of the difference between the voltage on the first capacitor and a comparison voltage.

The control block is arranged for converting the comparator's output in a signal for steering the charge copying circuit and for steering the pre-charge circuit, and in a digital output signal. Depending on the output of the comparator, the second capacitive structure is connected in parallel to the first capacitor with a first polarity or with a second polarity that is opposite the first polarity.

In a preferred embodiment the charge copying circuit is a switch.

In another embodiment the control block may further comprise of a register for storing the digital output signal.

In another embodiment the first capacitor may be charged to a differential input. The step of comparing then comprises the step of comparing a differential voltage. No separate comparison voltage is required.

Alternatively the circuit may comprise a plurality of said successive approximation circuits, switchably connected in parallel.

In a preferred embodiment an n-bit analog to digital conversion method is disclosed. This conversion method comprises the steps of successively approximating said input voltage by a digital output. First, a successive capacitor is charged. Further, the difference between the voltage on said successive capacitor and a comparison voltage is compared. A charge sharing occurs between said first and said successive capacitor. The polarity of the charge sharing is dependent on the outcome of this comparison. Additionally, dependent on this comparison, a digital output is generated. These steps are repeated for each bit for outputting an n-bit digital output.

In another embodiment, the control block may further comprise of a register for storing the successive digital output signals.

In another embodiment, the control block is arranged for running on a clock for generating the steering signals.

In another embodiment, the control block is arranged for running asynchronously, clocked by a digital controller.

In an alternative embodiment the pre-charging in the successive approximation circuit is controlled by a current source.

In another embodiment, the analog to digital conversion circuit may further comprise a sample-and-hold circuit. The sample-and-hold circuit comprises of a third capacitive structure, switchably connected in parallel with the input voltage and the first capacitive structure. The sample circuit may further comprise a current source to control the sample action.

An integrated circuit (IC) may comprise a circuit according to any of the previous embodiments.

An analog-to-digital conversion method comprises the step of charging a first capacitor to a charge indicative of an input voltage. This charging is done by connecting a first capacitor to the input voltage. A second capacitor is also charged by a pre-charge circuit. Thereafter, the difference between the voltage on said first capacitor and a comparison voltage is compared by a comparator. With a polarity depending on the result of said comparison, charge sharing between said first and said second capacitor occurs. Further, a digital output is generated, depending on the result of the comparison. Said charge sharing preferably comprises the step of closing a switch. The digital output may be stored in a register.

In another embodiment, the method further comprises the step of storing the digital output.

In another embodiment, the step of charging the first capacitor comprises the step of charging the first capacitor to a differential input. The step of comparing then comprises the step of comparing a differential voltage.

In a preferred embodiment, the present method comprises the step of successively approximating the input voltage by a digital output signal. The method comprises of the following steps. A successive capacitor is charged. The difference between the voltage on the successive capacitor and a comparison voltage is compared by a comparator. With a polarity depending on the result of said comparison, charge sharing between the first and the successive capacitor occurs. Further, a digital output is generated, depending on the result of the comparison. The digital output may successively be stored in a register.

In another embodiment, said step of charging a second capacitive structure further comprises the step of controllably charging said second capacitive structure with a controllable current source.

In another embodiment, the method of analog to digital conversion comprises the step of sampling and holding the input voltage. Said step of sampling and holding the input voltage may further comprise the step of charging said first capacitor by connecting this capacitor to an input voltage. Further, the charge is shared between said first capacitor and a third capacitor. In another embodiment, the step of sampling comprises the step of controllably sampling said input voltage via a controllable current source.

DETAILED DESCRIPTION

Figure 1:
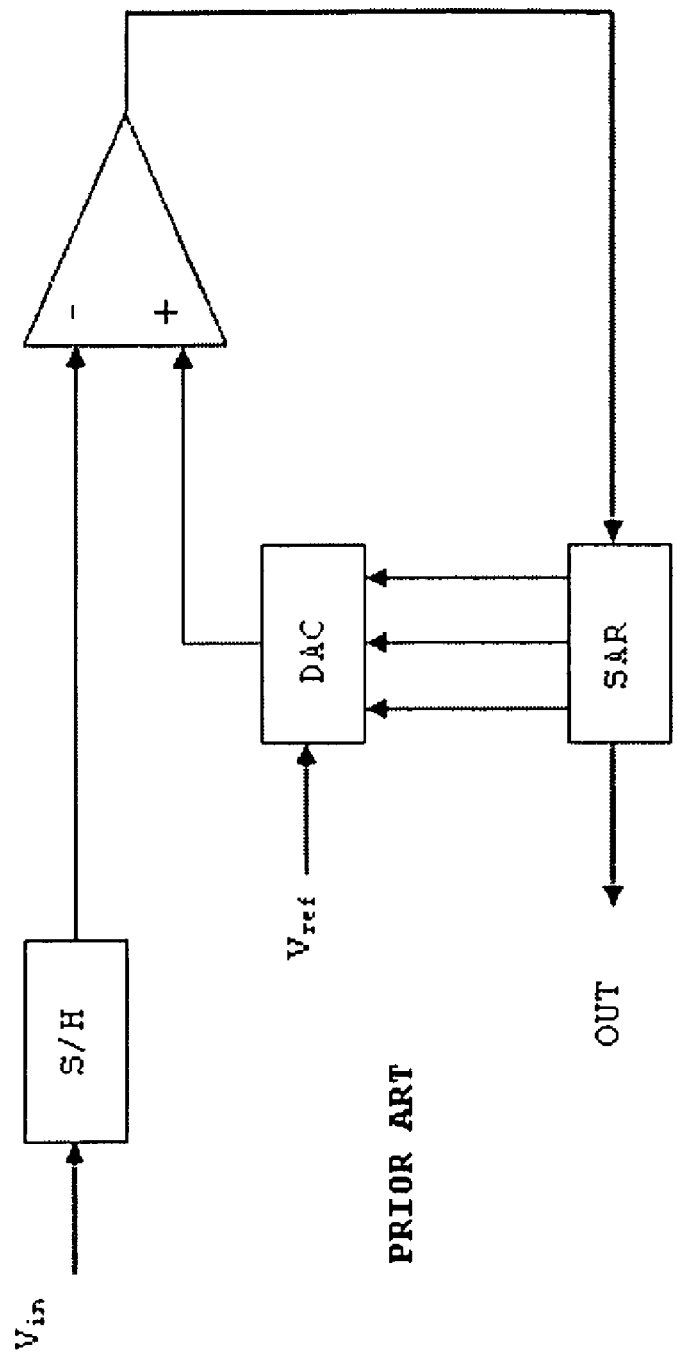
FIG. 1 represents a block diagram of a prior art SAR ADC.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein. It should be understood that systems and methods described as including certain components or steps may also include additional components or steps.

The present disclosure endeavours to provide an SAR ADC that has a fast settling time (FIG. 2), has a good figure of merit and is scalable. Instead of operating in the voltage-domain, the useful signal is represented by charge. Operation is performed in the charge domain. The use of opamps is diminished where possible.

Figure 2:
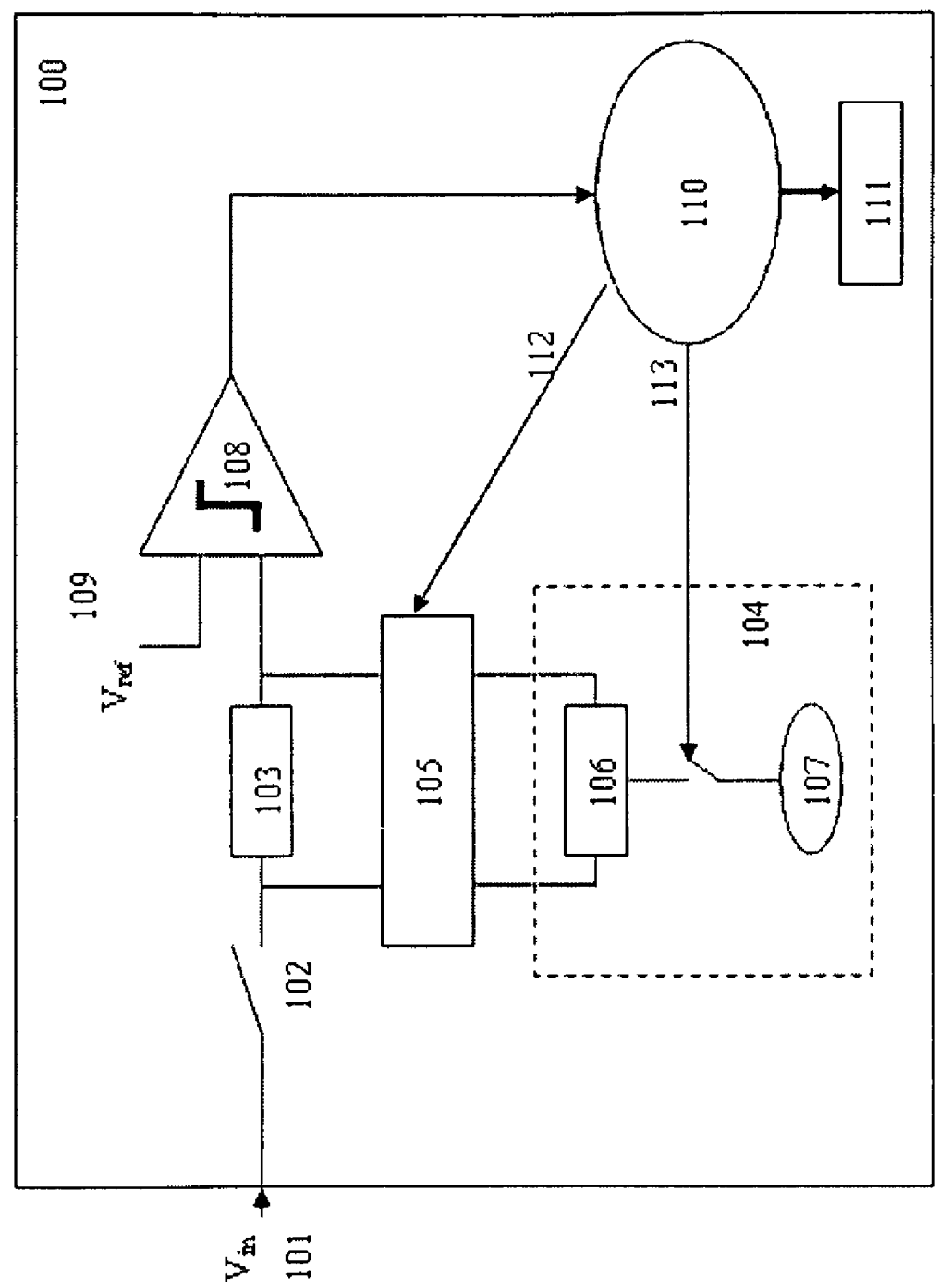
FIG. 2 represents a block diagram of an analog to digital conversion circuit.

An analog-to-digital conversion circuit (100) is illustrated in FIG. 2. A first capacitor (103) is connected by a switch (102) to an input voltage (101). The capacitor (103) is charged to the input signal (101). The approximation circuit comprises of at least one successive approximation circuit (104). This successive approximation circuit includes a second capacitive structure (106), switchably connected to a pre-charge circuit (107). This second capacitive structure is connected in parallel with the first capacitor (103) via a charge copying circuit (105) between them. A comparator (108) is arranged for outputting a sign indicative of the difference between the voltage on the first capacitor (103) and a comparison voltage (109). A control block (110) is arranged for converting the comparator's output partly in control signals (112), (113) and partly in a digital output (111).

Figure 3:
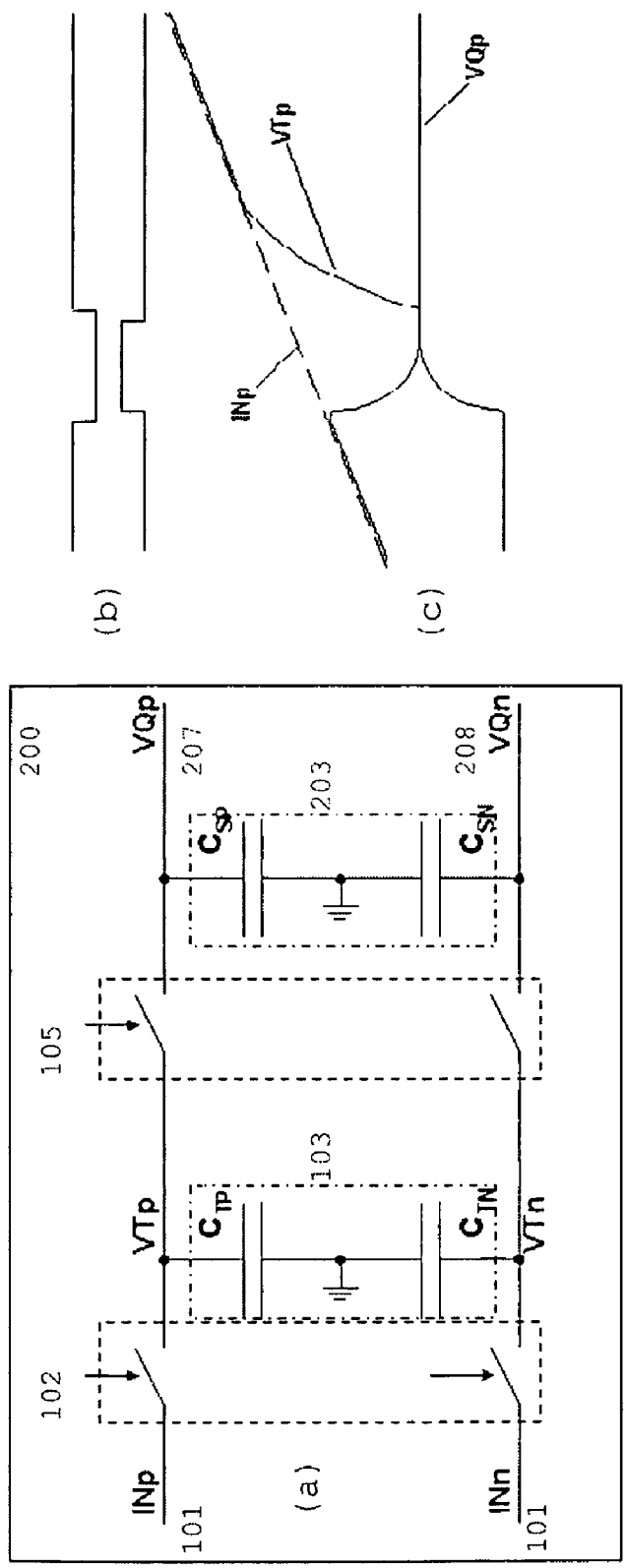
FIG. 3 represents the track and sample circuit.

In a preferred embodiment, the presented SAR ADC comprises a track (T) and sample (S) circuit (FIG. 3 (a)). There is a passive charge sharing between the tracking and sample capacitors. No active power is required and it goes very fast. The D-to-A signal is a charge.

In a preferred embodiment the input voltage is a differential input.

In the track and sample circuit (200), the desired output signal is the charge on the sampling capacitors $C_{SP}$ and $C_{SN}$ (203). When the input voltage needs to be sampled, the tracking switch (102) opens, leaving a charge $Q_T = V_{in} \cdot C_T$ on the tracking capacitors (103). Then the sampling switch (105) closes, and a charge sharing occurs between the tracking capacitors (103) (with charge $Q_T$) and the sampling capacitors (203) (which had been reset previously and thus has zero charge). If $C_S$ and $C_T$ are the same size, the sampled input signal in the charge domain thus equals $$Q_S = Q_T \cdot \frac{C_s}{C_s + C_T} = V_{in} \cdot C_T \cdot \frac{C_s}{C_s + C_T} = \frac{V_{in}}{2} \cdot C_s$$

Only a small amount of time is needed for the charge sharing (basically determined by the time constant of the switch resistance and the capacitance), and no active circuitry that requires biasing current. Once the input has been sampled this way, the sampling switch (105) opens, and the tracking switch (102) closes such that the signal on the tracking capacitors (103) can follow the input signal again. Slow settling is allowed here, as the next sampling will only occur much later (after the successive approximation by the ADC) (FIGS. 3 (b) and (c)).

If the input voltages are given by $$IN_p = V_{cm} + \frac{V_{in}}{2} \text{ and } IN_n = V_{cm} - \frac{V_{in}}{2},$$

with $V_{cm}$ the common mode level and $V_{in}$ the differential input signal, the voltages on nodes $VQ_p$ (207) and $VQ_n$ (208) after sampling is equal to half the value and the charges on the capacitor $C_S$ is given by $$Q_{ps} = \frac{C_s(2V_{cm} + V_{in})}{4}$$

$$Q_{ns} = \frac{C_s(2V_{cm} - V_{in})}{4}$$

The differential voltage on the nodes $VQ_p$ (207) and $VQ_n$ (208) is noted by VQ, so $$VQ = \frac{V_{in}}{2}.$$

Figure 4:
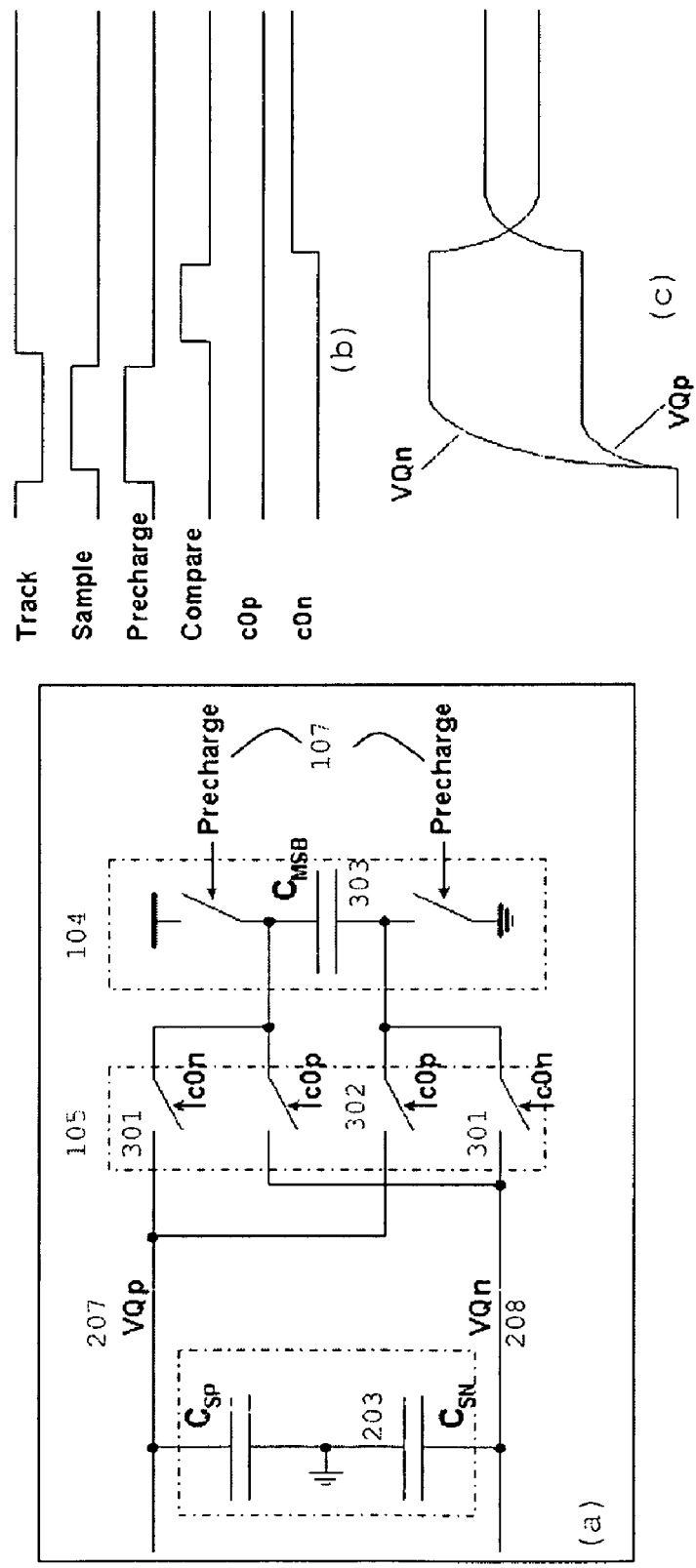
FIG. 4 represents the comparison and charge sharing action for the most significant bit (MSB) detection.

Next the analog-to-digital conversion can start (FIG. 4). First, the most significant bit (MSB) is determined first by using the comparator to check if the voltage on the differential nodes ($VQ_p$ (207) and $VQ_n$ (208)) is positive or negative. Depending on that decision, a signal proportional to half of the input range is subtracted or added to the input signal. In order to avoid tough specs on the voltage settling time with opamps, a charge is added to the signal on ($VQ_p$ (207) and $VQ_n$ (208)), instead of a certain voltage. This operation can be carried out by passive charge sharing (as was already applied in the input sampling process) and happens very fast. No power is consumed by the charge sharing itself. This charge is taken from a capacitor of a certain size that has been pre-charged (107) previously to a certain voltage, e.g. the power supply voltage. If the comparator input voltage is positive ($VQ_p$ (207)>$VQ_n$ (208)), the switches controlled by $c_{0p}$ (105) are closed, after which the charges on the three capacitors ($C_{SP}$ and $C_{SN}$ (203) and $C_{MSB}$ (303)) redistribute. The voltage $VQ_n$ (208) will rise and $VQ_p$ (207) will fall. Likewise, if the comparator input voltage is negative ($VQ_p$<$VQ_n$), the switches controlled by $c_{0n}$ (301) are closed, after which voltage $VQ_n$ (208) will fall and $VQ_p$ (207) will rise (FIG. 4 (c)). In other words, $C_{MSB}$ (303) is connected in parallel to $C_{SP}$ and $C_{SN}$ (203) with a given polarity or with the opposite one depending on the output of the comparator.

The differential voltage on $VQ_p$ (207) and $VQ_n$ (208) after charge sharing is given by $$VQ_1 = -\frac{2S_0 C_{MSB} V_{ref} - C_s V_{in}}{2(-C_s + C_{MSB})}$$

where $S_0$ represents the output of the comparator (+1 for positive, −1 for negative signal on VQ). $V_{ref}$ is the differential reference signal. This operation is depicted in FIG. 4 (c).

Figure 5:
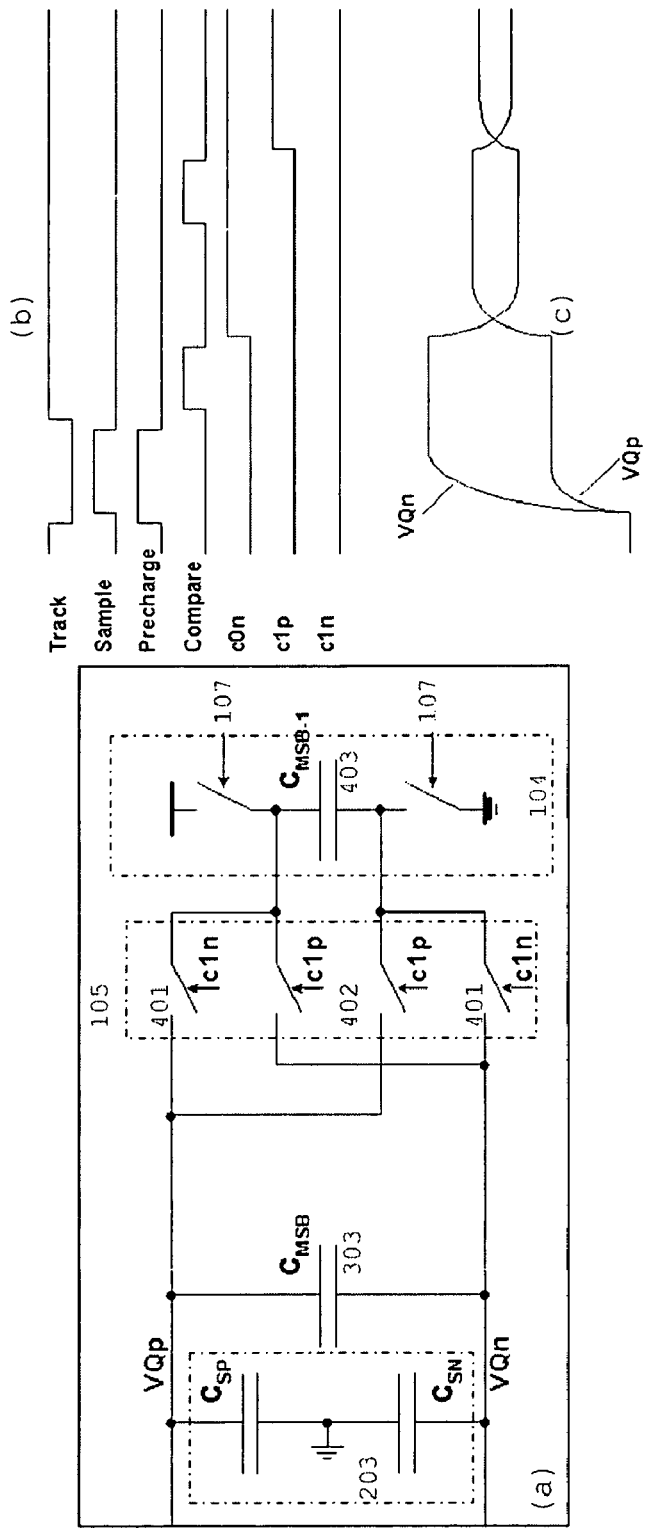
FIG. 5 represents the comparator and charge sharing action for the second bit.

The following bit is determined in the same way as depicted in FIG. 5. The same action as aforementioned is performed. The D-to-A signal is 2 times smaller by using a 2 times smaller capacitor. A capacitor (403) of size $C_{MSB-1} = C_{MSB}/2$ is pre-charged (107) to a reference voltage, e.g. supply voltage. This is the charge that will be used for the feedback D-to-A action. Again, depending on the sign of $VQ_p - VQ_n$, the switches $c_{1p}$ or $c_{1n}$ (105) are closed, and the following charge sharing action between $C_{SP}$ and $C_{SN}$ (203), and $C_{MSB}$ (303) and the newly connected $C_{MSB-1}$ (403) causes the voltages $VQ_p$ (207) and $VQ_n$ (208) to rise or fall (FIG. 5(c)).

The total charge that is present on the combination of the sampling capacitors and the unit capacitors that have been switched in up is given by:

$$Q_{tot2} = \frac{1}{2} C_s V_{in} - S_0 C_{MSB} V_{ref} - \frac{1}{2} S_1 C_{MSB} V_{ref}$$

where $S_0$ and $S_1$ represent the output of the comparator (+1 for positive, −1 for negative signal on VQ) for the first and second comparison, respectively. From that it can be seen easily that already two steps have been taken in the successive approximation of the input signal (represented in charge) by means of the addition/subtraction of two binary scaled units of charge.

The process is repeated again with a pre-charge capacitor again two times smaller than for the previous bit. The total charge remaining is given by:

$$Q_{tot3} = \frac{1}{2} C_s V_{in} - S_0 C_{MSB} V_{ref} - \frac{1}{2} S_1 C_{MSB} V_{ref} - \frac{1}{4} S_2 C_{MSB} V_{ref}$$

which shows that again a step in the successive approximation has been taken.

It can be seen that the SAR algorithm at each step uses these pre-charged capacitors to add or subtract a binary scaled-down charge to the initial charge (representing the sampled input voltage) until the result converges to zero. If too much charge was added during a certain step, the next comparison returns the opposite sign and in the next step the charge is subtracted. The actual value of the voltage on the nodes ($VQ_p$ (207) and $VQ_n$ (208)) is not needed, just the sign is used to determine if the next binary scaled down capacitor (and hence, charge) must be connected positively of negatively.

Figure 6:
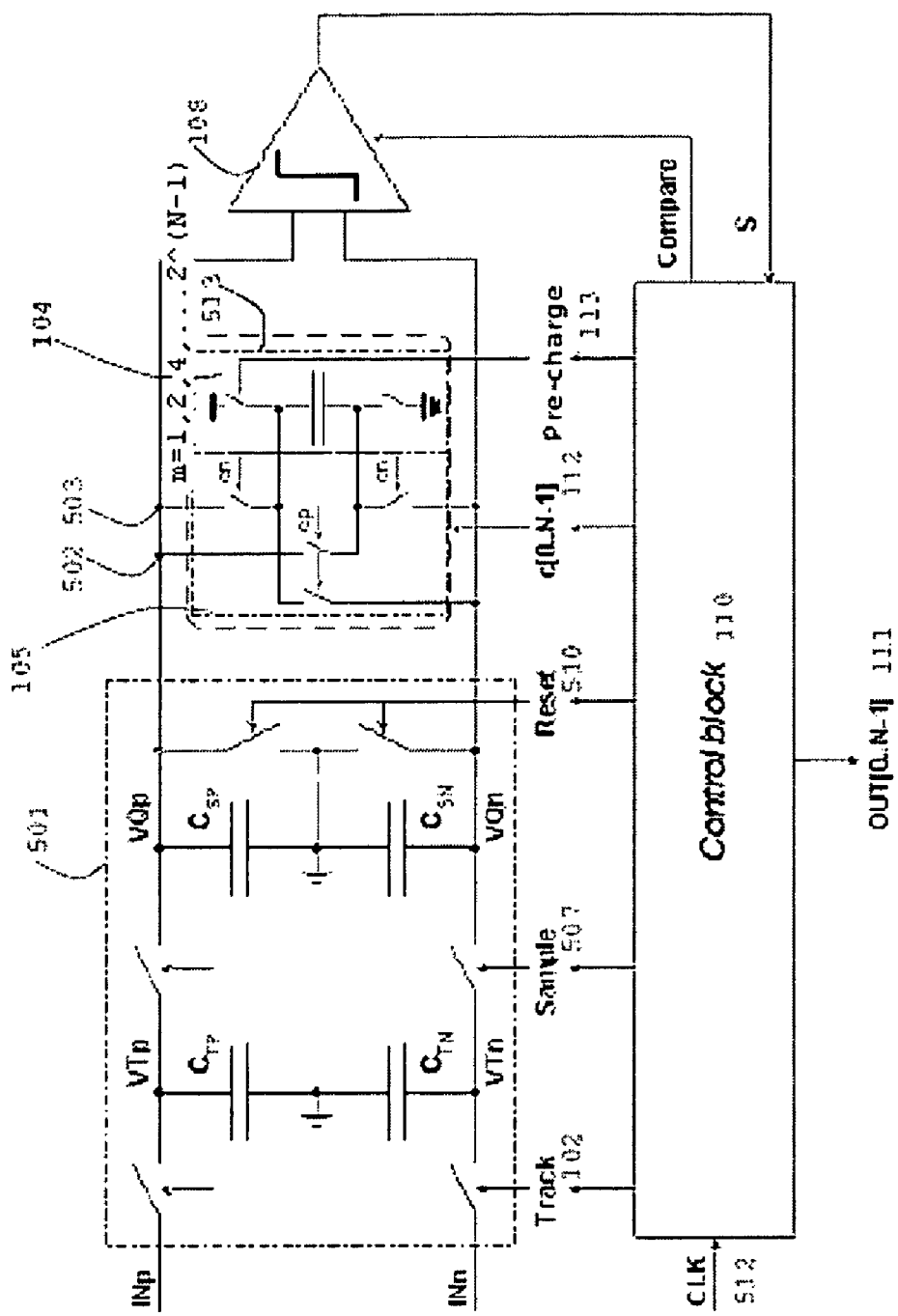
FIG. 6 represents a block diagram of the basic charge sharing SAR ADC.

The basic block diagram of a proposed ADC is depicted in FIG. 6. It comprises a track and sample circuit (501); each circuit comprising a capacitor and switches. A successive approximation circuit (513) includes a binary scaled array of unit capacitors that are pre-charged to a reference voltage (104), e.g. supply voltage, and that afterwards are connected positively (502) or negatively (503) to the sampling capacitor, depending on the outcome of the comparator (108). The SAR algorithm is implemented by a control block (110). The control bock (110) generates the track (102) and sample (507) signals. Simultaneously, the pre-charge signal (113) is generated. For every bit of the ADC, the control block runs through a loop; the control block activates the comparator (108), interprets its result and closes one of the switches $c_p$ or $c_n$ (112). Subsequently, a reset signal (510) is generated that removes all charge from the sampling capacitors to prepare for the next conversion. The digital value that represents the digitized value of the input voltage is outputted as a digital code (111).

Figure 7:
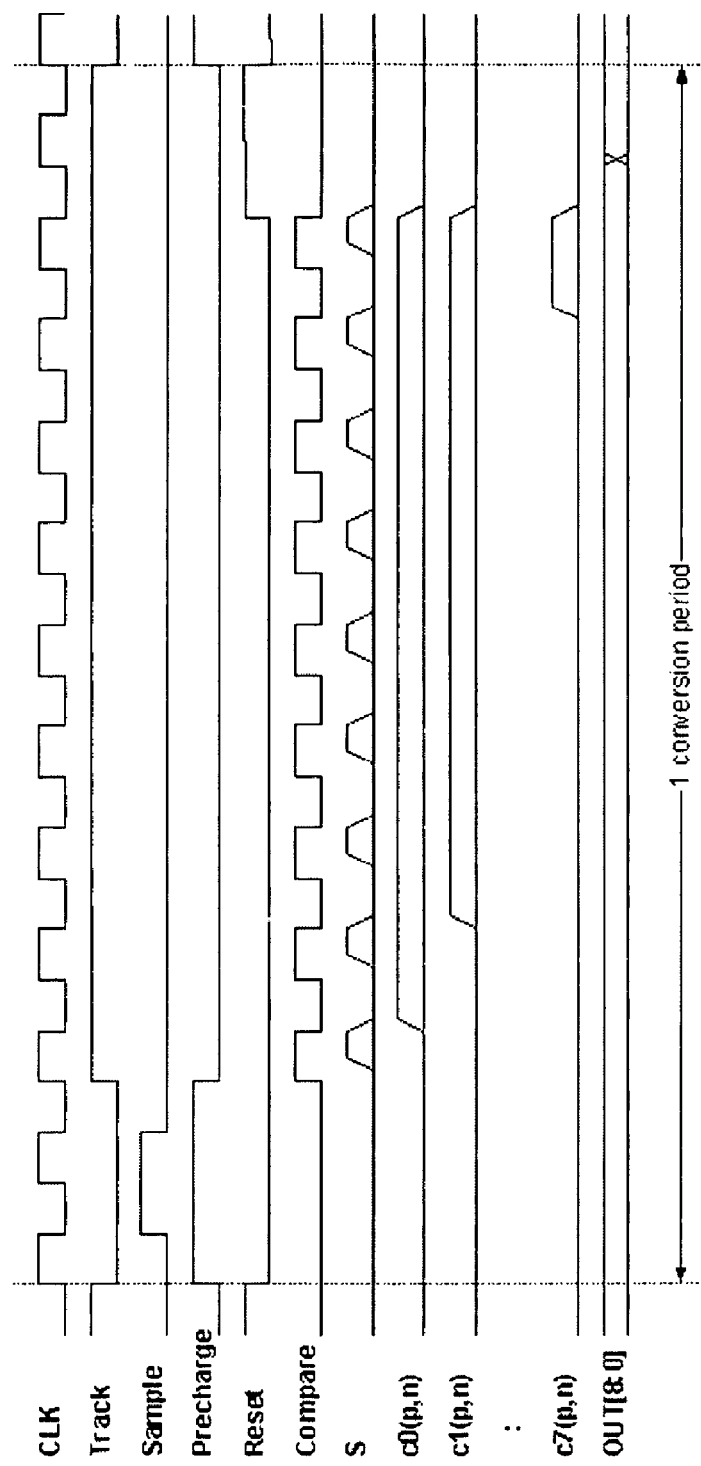
FIG. 7 represents an example of a control block timing.

In a preferred embodiment, the control block can run on a clock (512) that is several times higher than the needed sampling frequency, in order to generate consecutively all the required signals. An example is shown in FIG. 7, which uses a clock at a frequency 12 times higher than the conversion rate of the ADC, e.g. for power consumption and speed, you want a 500 MHz clock. These 12 short periods are used as follows:
  2 periods for the input sampling (stop tracking, sample on Cs, and restart tracking)
  9 periods for determining the 9 output bits, each divided into
    when CLK=high: comparison phase
    when CLK=low: charge-sharing phase after interpretation of the comparator result and activation of the switches $c_p/c_n$.
    Please note that for a 9-bit ADC, 9 comparisons are used but only 8 charge-sharing events.
  1 period for resetting the sampling capacitors and outputting the digital code.

Figure 8:
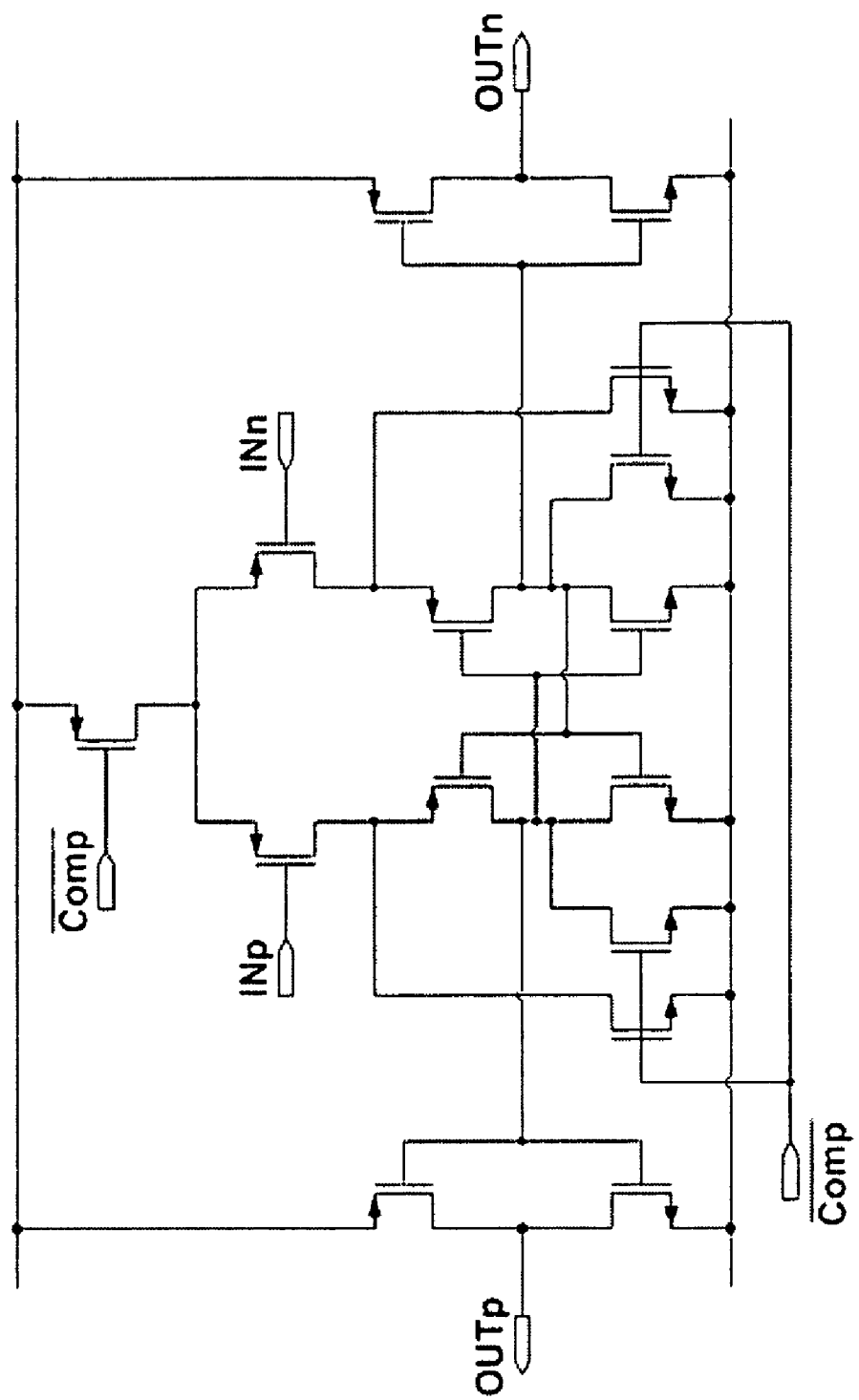
FIG. 8 represents a comparator implementation.

Some advantages of the proposed SAR ADC are the following. This circuit can achieve a power consumption that is an order of magnitude smaller than previous solutions. The only power-consuming parts of the ADC in a preferred embodiment are: 1) the pre-charge of the capacitors to a reference voltage (only the charge is taken from the power supply, no extra active blocks are needed to perform this action); 2) the comparator; and 3) the control block (but this is a purely digital circuit). Such an ADC approaches the real lower limit that can be achieved by a SAR ADC. No (fast-settling) opamps need to be used as in a switched-capacitor implementation. No transconductors or current DAC needs to be used as in a current-mode implementation. The predicted figure of merit FoM is about 50 fJ/conversion step, whereas current ADCs generally only achieve values slightly lower than 1 pJ (0.5 pJ: factor 10). Another important advantage is that the circuit's performance is linearly scalable with the conversion rate. In preferred embodiments, the circuits only consume current when they are activated. E.g. the comparator is preferably designed such that it only powers up when it receives a command to do the comparison, and immediately powers down again. An example circuit is given in FIG. 8. As there are no circuit blocks that take a fixed current, the power consumption decreases linearly with sampling frequency. Further, the ADC accuracy is firstly determined by capacitor matching, which is well controlled in modern silicon processing. Capacitor matching in the order of 0.1%, which gives 10-bit accuracy, is readily achievable. Finally, apart from the input sampling process, the complete operation of the ADC is linear. As only charge matters in the conversion process and all transistors are used as switches that are either opened or closed, no effect is seen from e.g. nonlinear capacitors or transistors.

In another embodiment, an asynchronous operation of the control block is introduced. The synchronous operation of the control block described above and in FIG. 7 uses a high-frequency clock. E.g. in a 9-bit 40 MS/s ADC, a 480-MHz clock is used, which in general is generated externally and also results in a power consumption penalty.

Moreover, the maximum speed possible with the circuit is not exploited, as this way of working requires the control block e.g. to wait until the falling edge of the clock to close one of the switches $c_p$ or $c_n$ although the comparator result S (FIG. 7) is already available earlier. All blocks (comparator speed, settling time for charge sharing) are designed fast enough to finish within the available clock period.

An asynchronous operation is proposed here that removes the need for an extra high-frequency clock, and allows analog-to-digital conversion at very high speed. A digital controller can implement this functionality. It removes the burden from the external clock generation and on top of that tracks the process variations to achieve maximal possible speed. The operation is as follows.
  At the rising edge of the (low-frequency, e.g. 40 MHz) clock, the signal track goes low, and then the signal sample goes high.
  The rising edge of the sample signal starts a delay cell that generates a signal being delayed long enough to allow full settling of the charge sharing between $C_T$ and $C_S$. The delay can e.g. be made by the time constant of a resistor (made of a MOS transistor in the linear region) and a capacitor. This way the delay tracks the time constant of the charge sharing action, which also depends on a MOS transistor and a capacitor.
  After this delay, the sample signal goes low again, and then the tracking signal goes high again, in order to already follow the input signal for the next conversion step. At this time also the pre-charge of the unit capacitor array is stopped, such that they are free to be connected to the sampling capacitor during the successive approximation operation.

Figure 9:
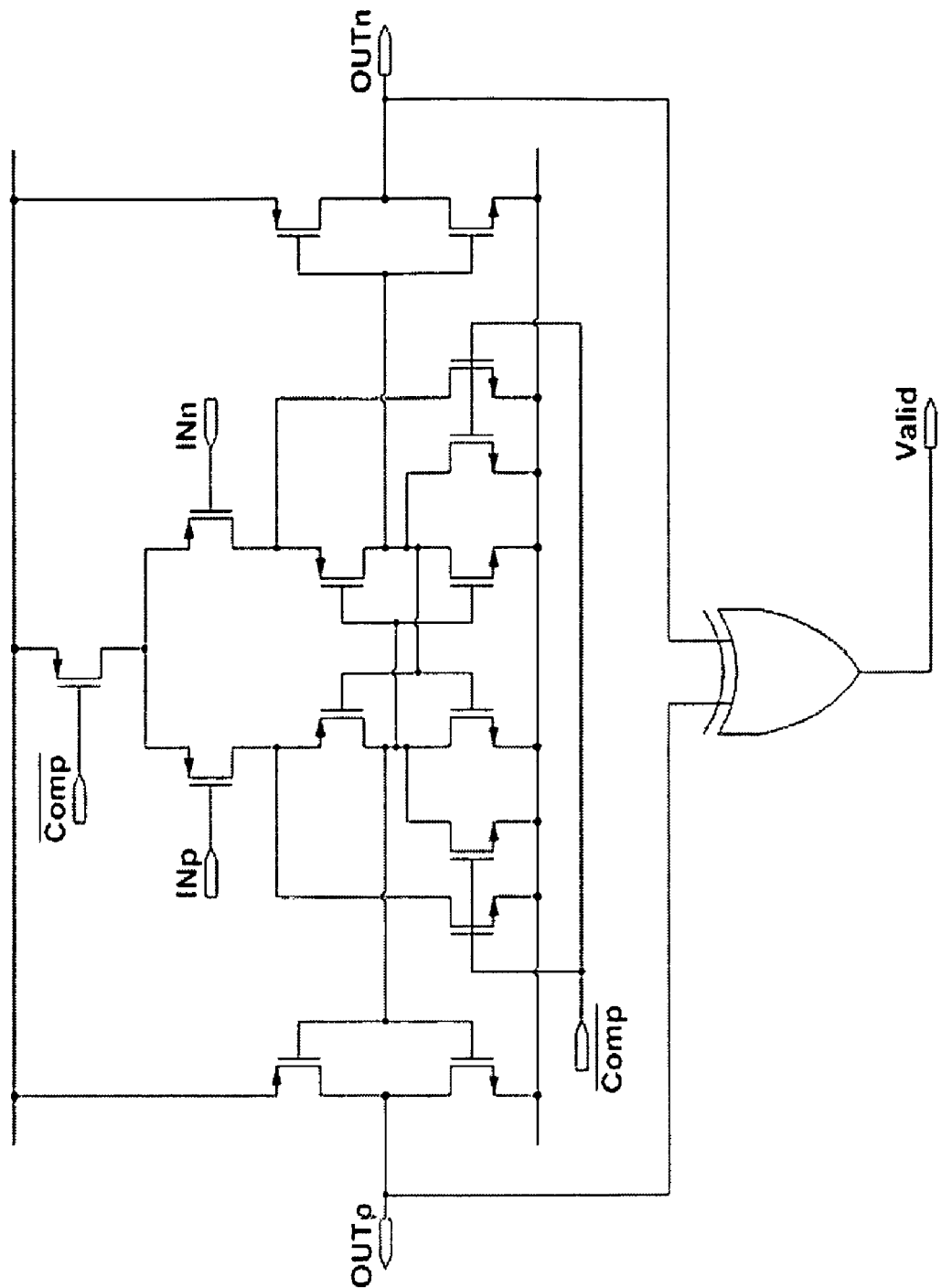
FIG. 9 represents a comparator for asynchronous operation.

Then the comparator is activated for the first time. Preferably the comparator is provided that also outputs a 'valid' signal. This signal goes high after the two cross-coupled inverters leave their meta-stable operating point and the comparison is finished. An example circuit implementation is shown in FIG. 9. The output signal 'Valid' goes high when the comparison result is ready.

On the rising edge of this valid signal, the control block decides to close either the switches c0p or c0n and the charge sharing action for the MSB starts.

Again a delay cell is activated to wait long enough for the charge sharing to complete.

Then the comparator is activated again, and so on until all bits are determined.

Next the output bits can be set, the reset switch can be closed to remove all remaining charge from the sampling capacitors, and the pre-charge of the capacitors to e.g. the power supply can be started. This pre-charge can last until the next clock period, when it is stopped after the charge sharing between the tracking and the sampling capacitor as described above.

In another embodiment, an ADC is presented wherein the size of the unit capacitors is improved. For an ADC with 10 pF tracking and sampling capacitance, the pre-charged capacitor for the MSB is in the order of 1 pF. As the latter is constructed from $2^7=128$ unit capacitors for a 9-bit ADC, the resulting unit should be about 8 fF, which is obviously too small to be used. The parasitics from the connections will be bigger than the actual capacitance.

An alternative for the most significant bits is certainly to use a bigger unit, e.g. eight times bigger. The capacitor controlled by $c_{0p,n}$ can now consist of 16 units of 60 fF, which is a value that can be practically used. The following one has eight units, and so on until the one controlled by $C_{4p,n}$ which has one unit.

For the next charge sharing, a 30 fF unit could be used, but this would not match correctly with a 'half' unit of 60 fF. Instead, since one only cares about the amount of charge connected to the sampling capacitors $C_S$, a 60 fF capacitor can also be charged to half of the power supply voltage. This is done by taking two units, keeping one of them empty and charging the other one to a reference voltage e.g. supply voltage $V_{dd}$. If then a switch between them is closed, the charge redistributes evenly and on each one a charge of 60 fF×$V_{dd}$ remains. This one can be used for the charge sharing by switches $C_{5p,n}$.

Figure 10:
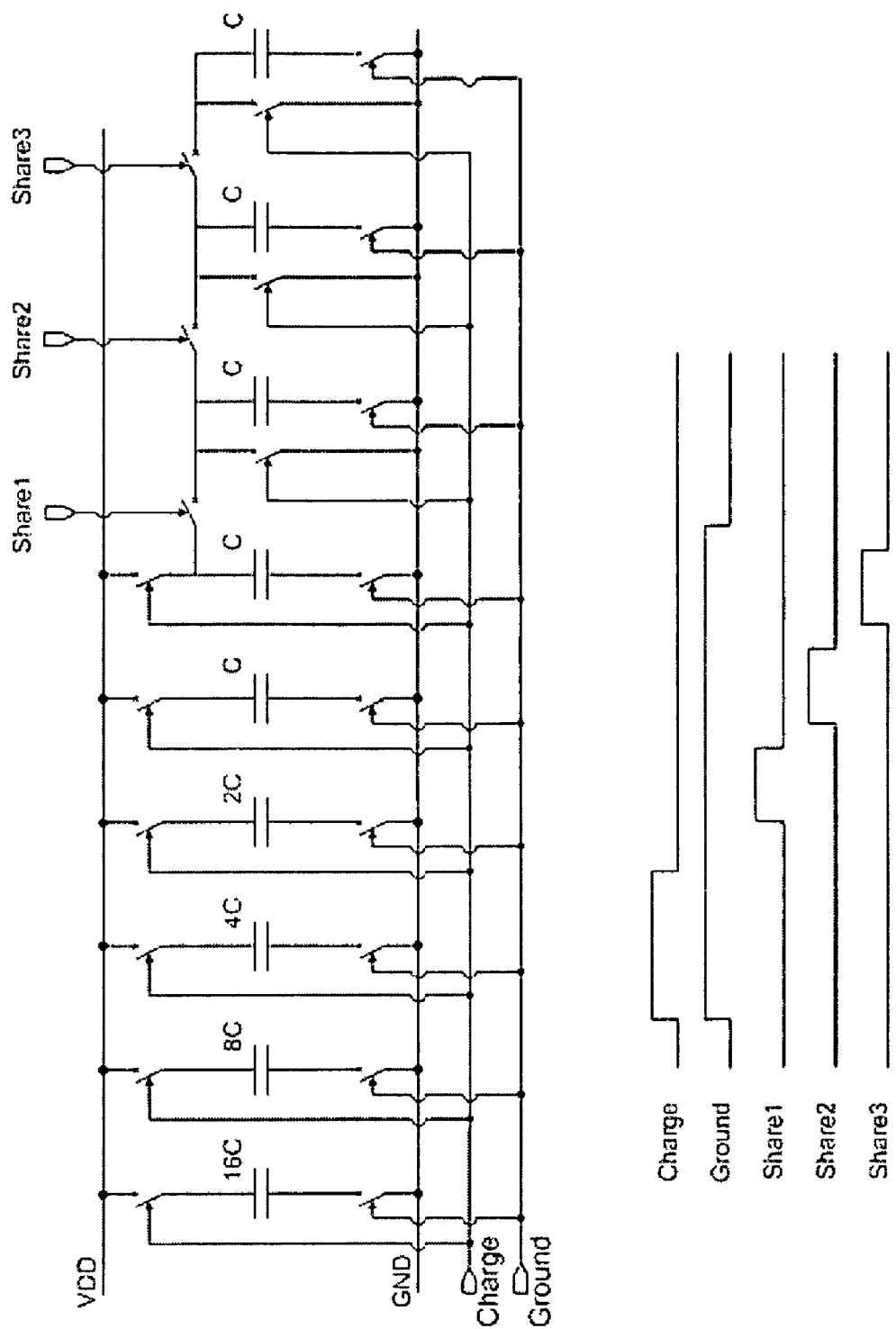
FIG. 10 represents an example of the capacitor array.

Also the next bits can be done similarly. If a switch is closed between the other unit with half of the charge and an empty one, on each of them one has one quarter of charge for the next bit, and so on. This structure has the advantage of the unit capacitor has a practical size. Further, the matching performance will improve slightly, as the units for the last significant bits (LSBs) are now made up out of bigger capacitor and hence match better. An example of this capacitor array is depicted in FIG. 10.

In another embodiment, a method is introduced to monitor the pre-charge process and consequently reduces the dependency of the successive approximation circuit on the reference voltage, which may simply be a supply voltage. When pre-charging the capacitors to the supply voltage, the gain of the ADC becomes in fact dependent on the power supply voltage and could fluctuate over time if the power supply is not constant. A solution to this is to monitor the pre-charge process and stop it as soon as it reaches a predefined threshold voltage given by, e.g. a bandgap.

Figure 11:
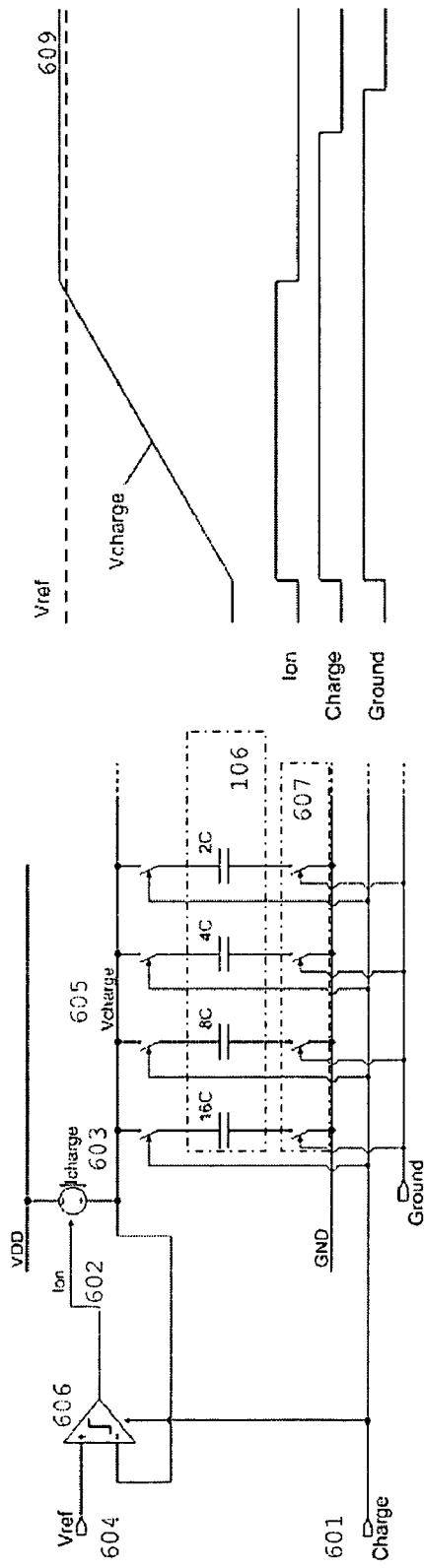
FIG. 11 represents a circuit diagram for pre-sharing the unit capacitor array.

A circuit that implements this operation is depicted in FIG. 11. When the signal Charge (601) goes high, the signal $I_{on}$ (602) driving the current source $I_{charge}$ (603) goes active. The voltage $V_{charge}$ (605) on the capacitor array starts to rise linearly. As soon as the predetermined threshold given by $V_{ref}$ (604) is reached, the comparator (606) detects this and de-activates the signal $I_{on}$ (602). As the current source is no longer active, the voltage $V_{charge}$ (605) stabilises. This action should be fed back to the controller as a trigger to set the signal Charge (601) low. A small delay can be built in here to allow the voltages on all capacitors of the array (106) to settle to the same value before opening all the switches (607). The comparator (606) is also powered down at this time; it should only consume current during the charging time and not during the actual operation of the successive approximation algorithm.

The operation of the ADC is not affected by a delay in the comparator. When taking a decision on the value of the charging current to be used, a high value is preferable, as this reduces the time needed to pre-charge. It is also beneficial for the power consumption budget, as the comparator only needs to be active during this time. Of course, because of the delay of the comparator, the actual voltage (609) obtained on the capacitor array is higher than the reference voltage, as the current source is switched off too late (as already indicated in FIG. 11). But since this delay is fixed, the correct operation of the ADC is not affected.

This technique is of course compatible with the technique aforementioned to improve the unit capacitor size. Moreover, besides using this technique to eliminate the dependency on the power supply voltage, it is also useful means to enlarge the size of the unit capacitors. Indeed, by choosing a low value for the reference voltage, larger capacitors can be used to keep the ADC working with the same amount of charge in the DAC feedback action.

This technique is also compatible with the asynchronous controller. The fact that the comparator triggers when the voltage on the unit capacitor array has crossed the reference voltage is also a trigger for the asynchronous controller that the pre-charge phase has ended and that ADC is ready for the successive approximation action.

In another embodiment, comparator-based input sampling action is introduced to reduce the input capacitance. Instead of charge-sharing with the sampling capacitor, activate a current source that starts to charge the sampling capacitor until the voltage held on the tracking capacitor is reached and the current source is stopped. The input capacitance of the ADC can turn out to be rather large, e.g. a value of 10 pF, because of practical aspects in the implementation of the unit capacitor array. Three alternatives of this embodiment are presented.

A first possibility is to provide the ADC with a buffer at the input. The power consumption of the buffer is a function of the input frequency range (i.e. up to the Nyquist frequency of the ADC), the size of the tracking capacitor and the required accuracy of the ADC.

Figure 12:
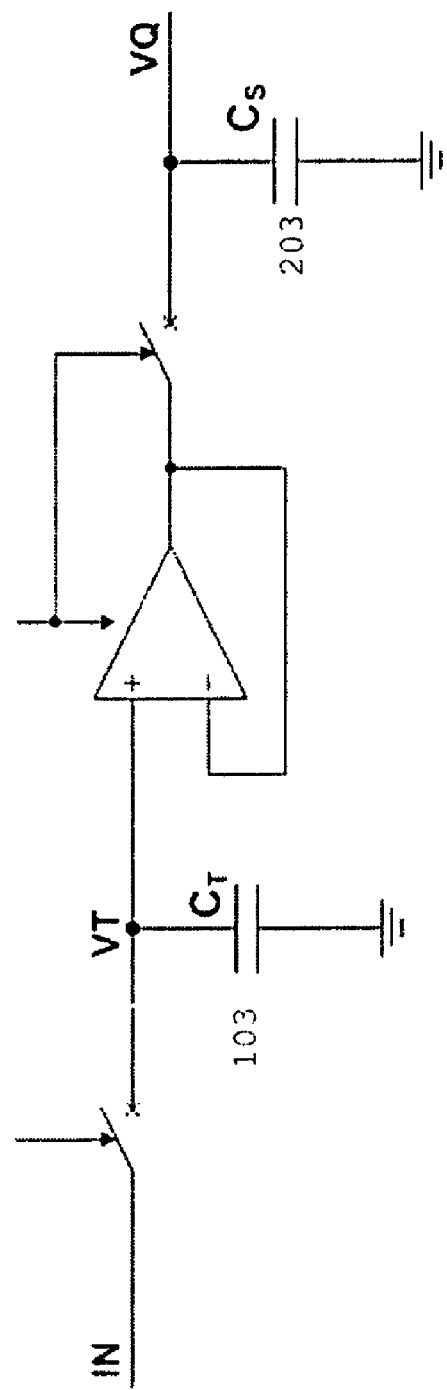
FIG. 12 represents the input sampling action using a buffer amplifier.

A second possibility is to replace the passive charge-sharing action during the input sampling process by an active sampling. This is depicted in FIG. 12, where the tracking action is still as before, but can now be done on a much smaller capacitance, as it is the voltage on $C_T$ (103) that is used and not the charge anymore. Instead of passively transferring half of the charge of $C_T$ (103) onto $C_S$ (203), an active buffer now copies the voltage on $C_T$ (103) onto $C_S$ (203), after which the standard charge-sharing based successive approximation A-to-D conversion can start.

The advantage of this with respect to the first solution is the fact that the buffer amplifier is only active during the sampling time, and does not have to follow all the dynamics of the input signal. When the ADC is converging during the successive approximation algorithm to the correct digital code, it can be powered down. There is of course a trade-off involved in choosing the length of the sampling time, as the opamp will have to settle to the correct voltage with the required accuracy within the given sampling time. Increasing the sampling time reduced the specs of the opamp, but lowers the final conversion speed of the ADC. It should also be noted that the full input voltage now appears onto $C_S$ (203) (and not half of it as in the passive charge sharing case), such that the value of $C_S$ (203) can be divided by 2 while still keeping the same charge on it as before. This also has consequences on the internal voltages of the ADC during operation, which will need to be taken into account during the design of the comparator and of the charge-sharing switches.

Figure 13:
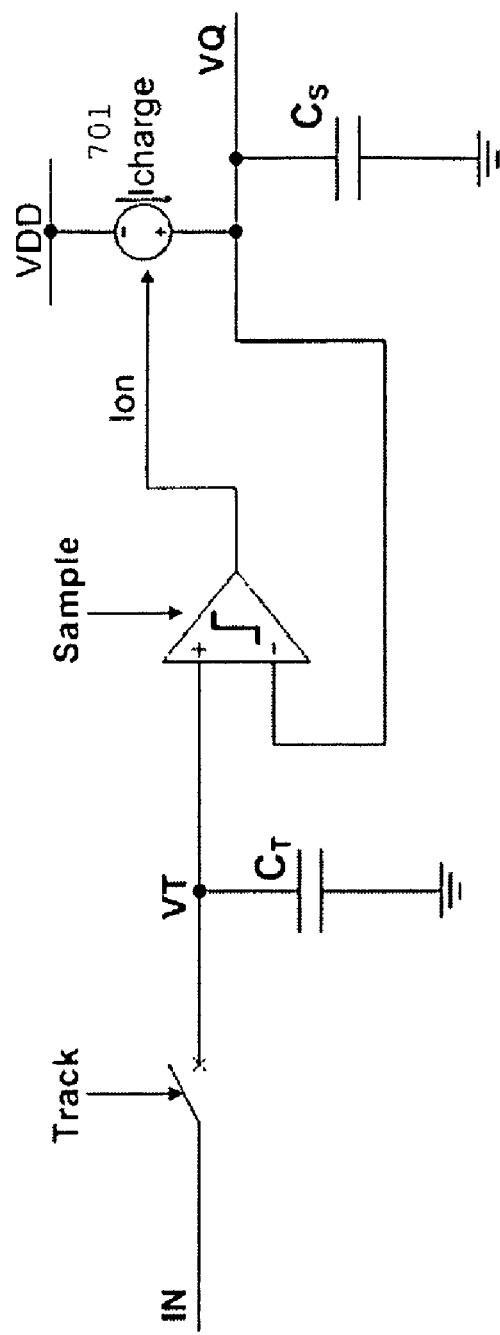
FIG. 13 represents the comparator based input sampling action.

In a third possibility (FIG. 13), it is not an opamp that is used to place the desired charge on $C_S$, but a current source (701). The voltage on the sampling capacitor is reset, and as soon as the sampling signal goes high, the current source is activated and the voltage VQ starts to rise linearly. When it approaches the same value as the voltage on the tracking capacitor, this comparator output toggles and the current source is disabled. A trigger can then be given to the controller that the sampling phase is finished, such that the comparator can be powered down and the ADC operation can continue.

The invention claimed is:

1. An analog to digital conversion circuit that includes:
a first capacitive structure that is switchably connected to an input voltage;
at least one successive-approximation circuit that includes:
a second capacitive structure,
a pre-charge circuit that is switchably connected to the second capacitive structure and is operative to pre-charge the second capacitive structure,
a comparator operative to output a sign signal indicative of the difference between a voltage on the first capacitive structure and a comparison voltage, and
a charge-copying circuit that switchably connects the second capacitive structure in parallel with the first capacitive structure, with a polarity selectable between a first polarity and a second polarity opposite the first polarity; and
a control block arranged for converting the sign signal into a signal for steering the polarity of the charge copying circuit and into a digital output signal.

2. A circuit according to claim 1, wherein the charge copying circuit is a switch.

3. A circuit according to claim 1, wherein the control block further includes a register for storing the digital output signal.

4. A circuit according to claim 1 wherein the input voltage is differential.

5. A circuit according to claim 4 wherein the comparator outputs a sign indicative of a differential voltage on the first capacitive structure.

6. A circuit according to claim 1 comprising a plurality of the successive approximation circuits, switchably connected in parallel.

7. A circuit according to claim 6 wherein the control block is arranged for converting successively the comparator's output in the signal for steering successively the charge copying circuit, and for steering the pre-charge circuit in the plurality of successive approximation circuits and in the digital output signal.

8. A circuit according to claim 6 wherein the control block further includes a register, for storing successively the digital output signal.

9. A circuit according to claim 1 wherein the control block is arranged for running on a clock for generating signals steering the switch.

10. A circuit as in claim 1 wherein the control block is arranged for running asynchronously, clocked by a digital controller.

11. A circuit according to claim 1 wherein the pre-charge circuit further includes a current source for controlling the pre-charge circuit.

12. A circuit according to claim 1, further comprising a sample-and-hold circuit.

13. A circuit according to claim 12 wherein the sample-and-hold circuit includes a third capacitive structure that is switchably connected in parallel with the input voltage and the first capacitive structure.

14. A circuit according to claim 12 wherein the sample-and-hold circuit further comprises a current source for controlling the sampling operation.

15. An integrated circuit that includes an analog to digital conversion circuit as recited in claim 1.

16. A method for converting an analog to digital signal, wherein the method includes:
a) charging a first capacitor by connecting the first capacitor to an input voltage,
b) charging a second capacitive structure,
c) comparing the difference between the voltage on the first capacitor and a comparison voltage,
d) selectively charge sharing between the first capacitor and the second capacitive structure with polarity that depends on the result of the comparing step, and
e) generating a digital output signal with a value that depends on the result of the comparing step.

17. A method according to claim 16, wherein the selective charge sharing comprises the step of closing a charge copying circuit connected in parallel in between the first capacitor and the second capacitive structure.

18. A method according to claim 16 further comprising the step of storing the digital output signal in a register.

19. A method according to claim 16, wherein charging the first capacitor comprises the step of charging the first capacitor to a differential input.

20. A method according to claim 19, wherein the comparing comprises the step of comparing a differential voltage.

21. A method according to claim 16 comprising the step of successively approximating the input voltage by a digital output signal comprising successively the steps of:
a) charging a successive capacitor,
b) comparing the difference between the voltage on the successive capacitor and a comparison voltage,
c) selectively charge sharing between the first capacitor and the successive capacitor with a polarity that depends on the result of the comparison, and
d) generating a digital output signal with a value that depends on the result of the comparing.

22. A method according to claim 21, wherein the successively approximating further comprises the step of storing successively the digital output in a register.

23. A method according to claim 16, wherein the step of charging a second capacitive structure further comprises the step of controllably charging the second capacitive structure with a controllable current source.

24. A method according to claim 16, further comprising the step of sampling and holding the input voltage.

25. A method according to claim 24, whereby the step of sampling and holding comprises the steps of
a) charging the first capacitor by connecting the first capacitor to an input voltage; and b) charge sharing between the first capacitor and a third capacitor.

26. The method as in claim 24, wherein the step of sampling further comprises the step of controllably sampling the input voltage via controllable current source.

27. An analog-to-digital conversion circuit that includes:
   a capacitive structure;
   means for storing a zeroth bit that indicates the polarity of a sample charge on the capacitive structure;
   means for sharing a first predetermined charge with the sample charge to create a first shared charge, wherein the first predetermined charge and the sample charge are shared with opposite polarity;
   means for storing a first bit that indicates the polarity of the first shared charge,
   means for sharing a second predetermined charge with the first shared charge to create a second shared charge, wherein the second predetermined charge and the first shared charge are shared with opposite polarity, and wherein the second predetermined charge is about half of the first predetermined charge;
   means for storing a second bit that indicates the polarity of the second shared charge.

28. An analog-to-digital conversion circuit according to claim 27 that also includes:
   means for sharing a sequence of predetermined charges with a plurality of respective shared charges, wherein each predetermined charge in the sequence is about half of its predecessor predetermined charge, and wherein each predetermined charge is shared with a polarity opposite that of its respective shared charge; and
   means for storing a plurality of bits that indicate the polarities of the respective shared charges.

* * * * *